(12) United States Patent
Wolford

(10) Patent No.: US 6,504,790 B1
(45) Date of Patent: Jan. 7, 2003

(54) CONFIGURABLE DDR WRITE-CHANNEL PHASE ADVANCE AND DELAY CAPABILITY

(75) Inventor: Barry Joe Wolford, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/925,257

(22) Filed: Aug. 9, 2001

(51) Int. Cl.[7] .................................................. G11C 8/00
(52) U.S. Cl. ........................................ 365/233; 365/194
(58) Field of Search ................................. 365/233, 194, 365/233.5

(56) References Cited

U.S. PATENT DOCUMENTS

| | | | | |
|---|---|---|---|---|
| 5,559,751 A | * | 9/1996 | Trinberger | .................. 365/233 |
| 5,822,255 A | * | 10/1998 | Uchida | ........................ 365/194 |
| 5,923,613 A | * | 7/1999 | Tien et al. | ................... 365/233 |
| 6,178,123 B1 | * | 1/2001 | Kato et al. | ................... 365/194 |

* cited by examiner

Primary Examiner—Tan T. Nguyen
(74) Attorney, Agent, or Firm—Carr Law Firm, L.L.P.; Robert M. Carwell

(57) ABSTRACT

The phase of a memory clock signal is adjusted by advancing and/or delaying the phase. A configuration register is used to determine the phase adjustment of the memory clock signal. The value of the configuration register can be changed through software. This flexible phase adjustment technique is valuable in meeting various timing requirements in a source synchronous memory controller.

14 Claims, 5 Drawing Sheets

CONFIGURABLE DDR WRITE-CHANNEL PHASE ADVANCE AND DELAY CAPABILITY

BACKGROUND OF THE INVENTION

1. Field of the Invention

The invention relates generally to phase-shifting capability in a memory device and, more particularly, to configurable phase advance and delay capability in a double data rate (DDR) synchronous dynamic random access memory (SDRAM).

2. Description of the Related Art

Double data rate (DDR) memory employs a source-synchronous clocking scheme in that a write data strobe (DDR_WDQS) must be propagated from the memory controller to the DDR memory along with the write data mask and write data (DDR_DM/WDBUS). In order for the DDR device to successfully and reliably capture write data, the time between the Write command and the first rising edge of DDR_WRDQS must fall within Tdqss range, which is defined as from 75% to 125% of 1 clock cycle from the Write command. This translates to a ½ cycle window that begins ¾ of a cycle from the cycle on which the Write command was sampled and ends 1 and ¼ of a cycle from the cycle on which the Write command was sampled by the DDR device. Additionally, the write data strobe must be center-aligned with the write data and write data mask, requiring the write data strobe to be delayed by ¼ of a DDR clock cycle with respect to the write data and write data mask. This narrow window is frequency-dependent and decreases as the frequency increases. The delays that affect the DDR_WDQS arrival time include the ASIC I/O driver delay, the board wiring topology and wiring delay, connector loading, and the like. These delays are dependent on process, voltage, and temperature, however they are essentially independent of the frequency of the interface operation.

These frequency-independent fixed delays take up an increasing percentage of the allowable path cycle time and path delay as the frequency increases, making it increasingly difficult to guarantee the aforementioned Tdqss timing requirement. Furthermore, the referenced independent delays may vary from application to application and from system implementation to system implementation. Thus, it becomes very difficult for the design of a single control circuit to satisfy the wide range of possible implementations, particularly as the propagation and circuit delays approach the time allotted for a Tdqss timing window.

Therefore, what is needed is a system and method for adjusting the DDR memory write channel interface timing.

SUMMARY OF THE INVENTION

The present invention provides a memory controller for a double data rate (DDR) synchronous dynamic random access memory (SDRAM). The memory controller comprises a configuration register and a first programmable delay. The first programmable delay receives a first set of one or more bits from the configuration register and a double-speed clock signal. The double-speed-clock signal has a frequency twice as large as the frequency of the internal memory controller clock signal. The memory controller comprises an XOR gate receiving a phase-delayed double-speed clock signal from the first programmable delay and a second set of one or more bits from the configuration register and a first flip-flop (FF) receiving a write command load signal and driven by the internal memory controller clock signal. The memory controller further comprises a first multiplexer receiving the output signal of the first FF and the write command load signal and controlled by a first control signal and a second programmable delay receiving the first set of one or more bits from the configuration register and the output signal of the first multiplexer. The memory controller also comprises more FFs including: a second FF receiving data mask and a low write data (DM/WDATA_L) signal and driven by an inverted signal of the internal memory controller clock signal; a third FF receiving data mask and a high write data (DM/WDATA_H) signal and driven by the internal memory controller clock signal; a fourth FF receiving the output signal of the second programmable delay and driven by the output signal of the first programmable delay; a fifth FF receiving the output signal of the fourth FF and driven by the output signal of the first programmable delay; and a sixth FF receiving the output signal of the fifth FF and driven by the output signal of the first programmable delay. The memory controller further comprises an OR gate receiving the output signal of the fourth FF and the output signal of the sixth FF; a seventh FF receiving the output signal of the OR gate and driven by the output signal of the first programmable delay; an eighth FF receiving the output signal of the OR gate and driven by the output signal of the first programmable delay; and a ninth FF receiving the output signal of the seventh FF and driven by the output signal of the first programmable delay. Additionally, the memory controller comprises a second multiplexer receiving the output signal of the seventh FF and the output signal of the ninth FF and controlled by a third set of one or more bits from the configuration register. A tenth FF is also included in the memory controller. The tenth FF receives the output signal of the second multiplexer, outputs a write data strobe (DDR_WDQS), and is driven by the output signal of the XOR gate. The memory controller further comprises a third multiplexer receiving the output signal of the second FF and the output signal of the third FF and controlled by the output signal of the eighth FF. Also, an eleventh FF is included in the memory controller to receive the output signal of the third multiplexer. The eleventh FF is driven by the output signal of the first programmable delay. A fourth multiplexer is included in the memory controller to receive the output signal of the third multiplexer and the output signal of the eleventh FF. The fourth multiplexer is controlled by the third set of one or more bits from the configuration register. Finally, the memory controller comprises a twelfth FF receiving the output signal of the fourth multiplexer, outputting a write data mask and write data (DDR_DM/WDBUS) signal, and driven by the output signal of the XOR gate.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The principles of the present invention and their advantages are best understood by referring to the illustrated embodiments and operations thereof depicted in FIGS. 1–5.

Figure 1:
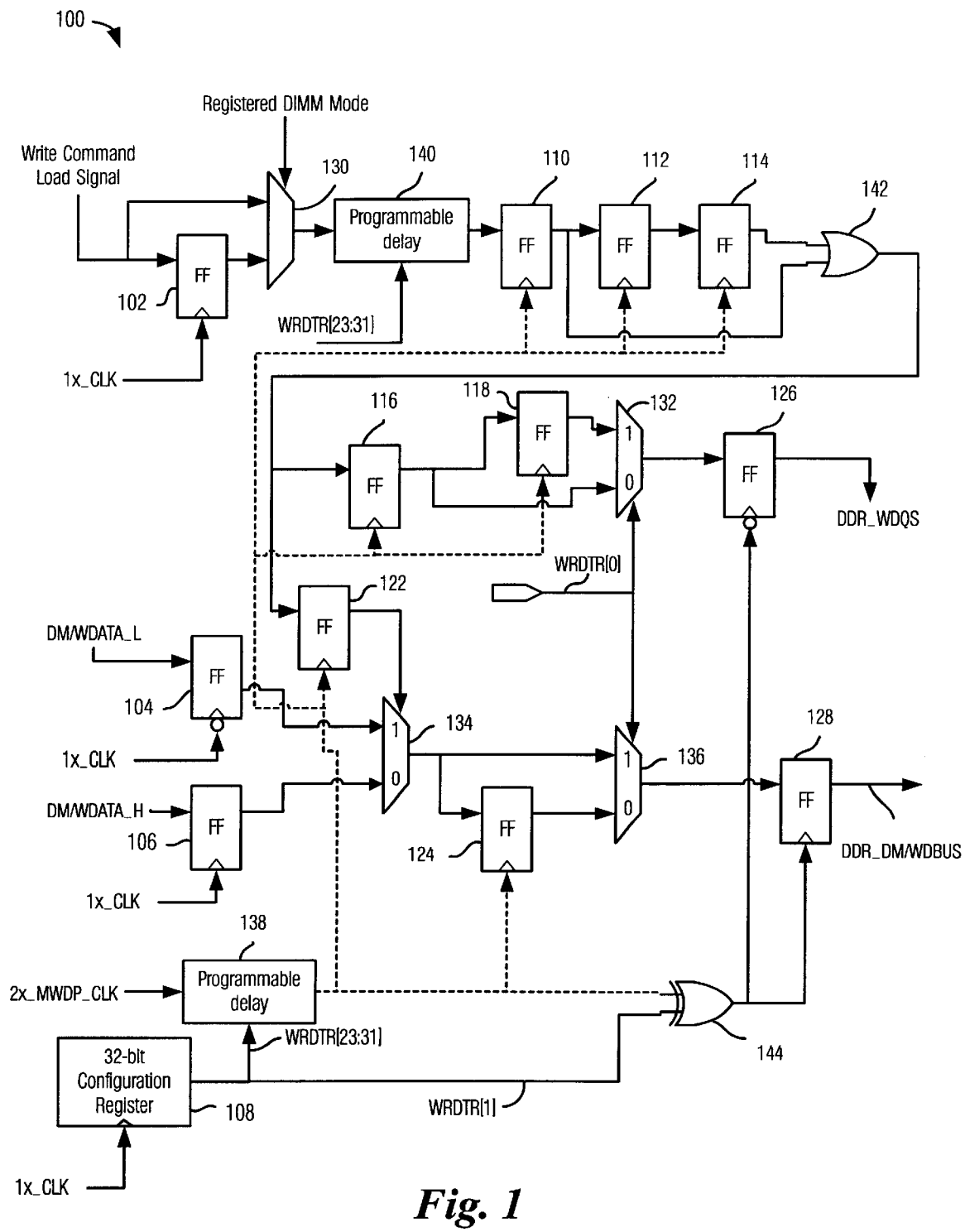
FIG. 1 depicts a block diagram embodying the present invention in a logic-circuit level.

A preferred embodiment of the present invention is described in the circuit 100 as shown in FIG. 1. Preferably, the circuit 100 is implemented in a DDR memory controller. The circuit 100 includes a number of interconnected components, namely, flip-flops (FFs) 102, 104, and 106, configuration register 108, FFs 110, 112, 114, 116, 118, 120, 122, 124, 126, and 128 (collectively referred to hereinafter as "110–128"), multiplexers 130, 132, 134, and 136, programmable delays 138 and 140, an OR gate 142, and an XOR gate 144. These components and respective interconnections are described in further detail below.

In the circuit 100, configuration and data internal to the core are clocked in the 1×_CLK domain. A double speed clock signal, 2×_MWDP_CLK, is used as part of the DDR write data path to achieve the double data rate transfers. Specifically, the FFs 102–106 and the configuration register 108 are clocked in the 1×_CLK domain, whereas the remaining FFs 110–128 are clocked in the 2×_MWDP_CLK domain, wherein MWDP is an abbreviation for Memory Write Data Path.

The FF 102 receives a Write command load signal as an input and outputs the Write command sampled in 1×_CLK clock domain. All clock inputs to the circuit 100 are derived from the system (on-chip or off-chip) clock generation logic circuitry such as a phase locked loop (PLL) (not shown). The Write command load signal comes from memory controller write state machines which control the interface specific sequencing of command to the memory. The Write command load signal sampled in 1×_CLK domain then goes through the multiplexer 130, which is controlled by a control signal called Registered DIMM mode. Registered MIMM mode is a control signal derived from a configuration register (not shown). The purpose of this signal is to indicate that an interface (e.g., memory interface) is operating in "registered" mode wherein the memory devices have a register added in the command path thus requiring the WDATA/DM to be delayed an additional cycle. The multiplexer 130 is connected to the programmable delay 140, which receives a configuration register bits WRDTR[23:31] as an input signal to adjust the phase delay to the signal received from the multiplexer 130, wherein WRDTR is an abbreviation for Write Data Timing Register. The number(s) in the bracket followed by a register name such as WRDTR indicate the bit number. For example, WRDTR[23:31] indicates nine configuration register bits from $24^{th}$ bit to $32^{nd}$ bit, it being understood that the $1^{st}$ bit is bit 0). Likewise, WRDTR[0] indicates bit 0 or the least significant bit. This notation will be used throughout this disclosure. A delayed signal generated by the programmable delay 140 goes through the FFs 110, 112, and 114 clocked in the 2×_MWDP_CLK domain.

The output of the programmable delay is connected to the input of the FF 110. The output of the FF 110 is connected to both the input of the FF 112 and an input of the OR gate 142. The output of the FF 112 is connected to the input of the FF 114. The output of the FF 114 is then connected to another input of the OR gate 142. The output signals of the FF 110 and the FF 114 are processed in the OR gate 142, the output signal of which is then fed to the FFs 116 and 122.

The output of the FF 116 is connected to both the input of the FF 118 and a first input of the multiplexer 132. The multiplexer 132 also receives a second input from the output of the FF 118. The multiplexer 132 is controlled by the configuration register bit WRDTR[0], which is the least significant bit of the configuration register 108. The output of the multiplexer 132 is connected to the FF 126, which outputs the DDR_WDQS (write data strobe). Thus, the multiplexer 132 connects the output of the FF 116 to the input of the FF 126 when the configuration register WRDTR[0] is 0, and connects the output of the FF 118 to the input of the FF 126 when the configuration register WRDTR[0] is 1.

The output of the OR gate 142 is also connected to the FF 122, whose output is used as a control signal of the multiplexer 134. The multiplexer 134 receives DM/WDATA_L signal sampled at an inverted 1×_CLK through the FF 104 and DM/WDATA_H signal sampled at 1×_CLK through the FF 106. Thus, the multiplexer 134 outputs the sampled DM/WDATA_L signal when the output of the FF 122 is 1, and outputs the sampled DM/WDATA_H signal when the output of the FF 122 is 0. The write data (WDATA) comes from write data buffers (not shown) in a memory controller (not shown). The data mask (DM) comes from command queue and data mask state machine logic circuitry (not shown) internal to the memory controller (not shown).

The output of the multiplexer 134 is then connected to the FF 124 and a first input of the multiplexer 136. The output of the FF 124 is connected to a second input of the multiplexer 136. The multiplexer 136 is controlled by the configuration register bit WRDTR[0]. Thus, the multiplexer 136 outputs its first input when the configuration register WRDTR[0] is 0, and outputs its second input when the configuration register WRDTR[0] is 1. The output of the multiplexer 136 is then transmitted to the input of the FF 128, which outputs DDR_DM/WDBUS. WDATA_L and WDATA_H represent the low and high portion, respectively, of the Write data bus. Write data is sent at twice the data rate with the high data sent in the first half of the cycle and the low data sent in the second half of the cycle.

As mentioned above, the FFs 110–128 are clocked in the 2×_MWDP_CLK domain. Since the programmable delay 138 delays the phase of the double speed clock signal 2×_MWDP_CLK before the clock signal is fed to the FFs 110–128, the FFs 110–128 are clocked by a phase-delayed double speed clock. The amount of delay is configurable by changing the value of the configuration register WRDTR[23:31].

The output of the programmable delay 138 goes directly to the clock inputs of the FFs 110–124 and to an input of the XOR gate 144. The other input of the XOR gate 144 is connected to the output of the configuration register 108, which samples the configuration register in the 1×_CLK domain.

The FF 126 is clocked by the inverted output signal of the XOR gate 144 and the FF 128 is clocked by the output signal of the XOR gate 144.

The circuit 100 contains a fine-tuning phase delay capability as well as 0, 90 and 180 degree phase advance capability. This fine tuning delay capability is enabled by the use of the programmable delay 138 on the double speed clock signal 2×_MWDP_CLK and by the use of the programmable delay 140 on the DDR_WDQS (write data strobe) generation pulse derived from the Write command. The 90 degree phase advance capability is provided by the addition of the XOR gate 144, controlled by the configuration register WRDTR[1], on the 2x_MWDP_CLK domain that drives the final output register stage for the DDR write channel signals. The 0 and 180 degree phase advance capability is provided by selecting an appropriate pre-drive register stage through configuration register bit WRDTR[0] and fed to the multiplexers 132 and 136.

FIGS. 2–5 exemplify phase advance and phase delay capabilities of the circuit 100 of FIG. 1.

Figure 2:
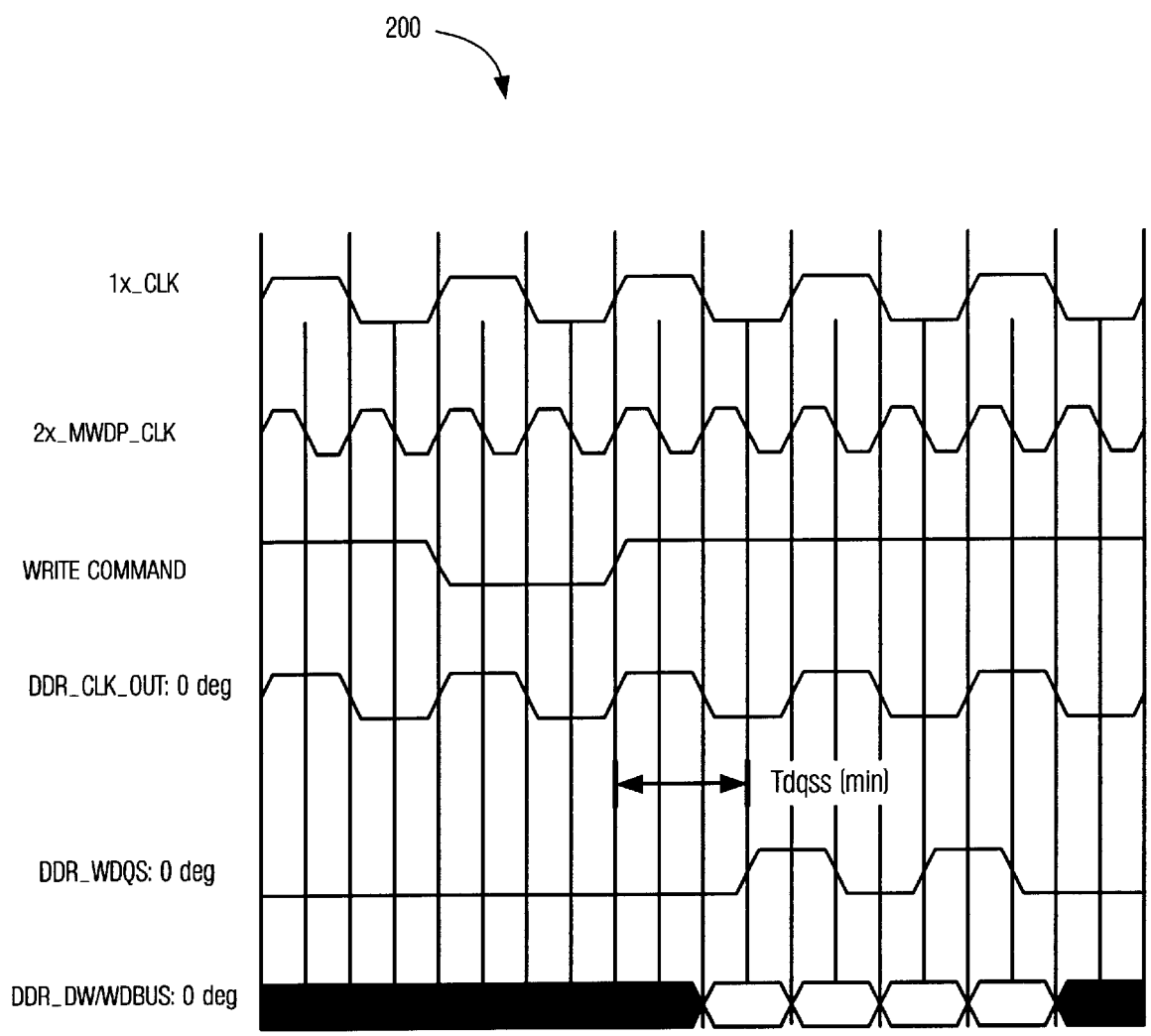
FIG. 2 depicts a timing diagram showing a memory clock phase aligned with Tdqss minimum.

Now referring to FIG. 2, a timing diagram 200 depicts a DDR memory clock phase-aligned with respect to the internal memory controller clock signal, 1x_CLK, as shown in FIG. 1. The DDR write data channel (DDR_WDQS, DDR_DM/WDBUS) is programmed for a 0 degree phase advance. This effectively launches the DDR write data channel signals 34 of a cycle from the cycle following the clock cycle in which the Write command load signal was launched, which equates to Tdqss minimum timing. The DDR write data channel signals can be delayed beyond the Tdqss minimum timing reference point via the programmable delays 138 and 140 as shown in FIG. 1.

Figure 3:
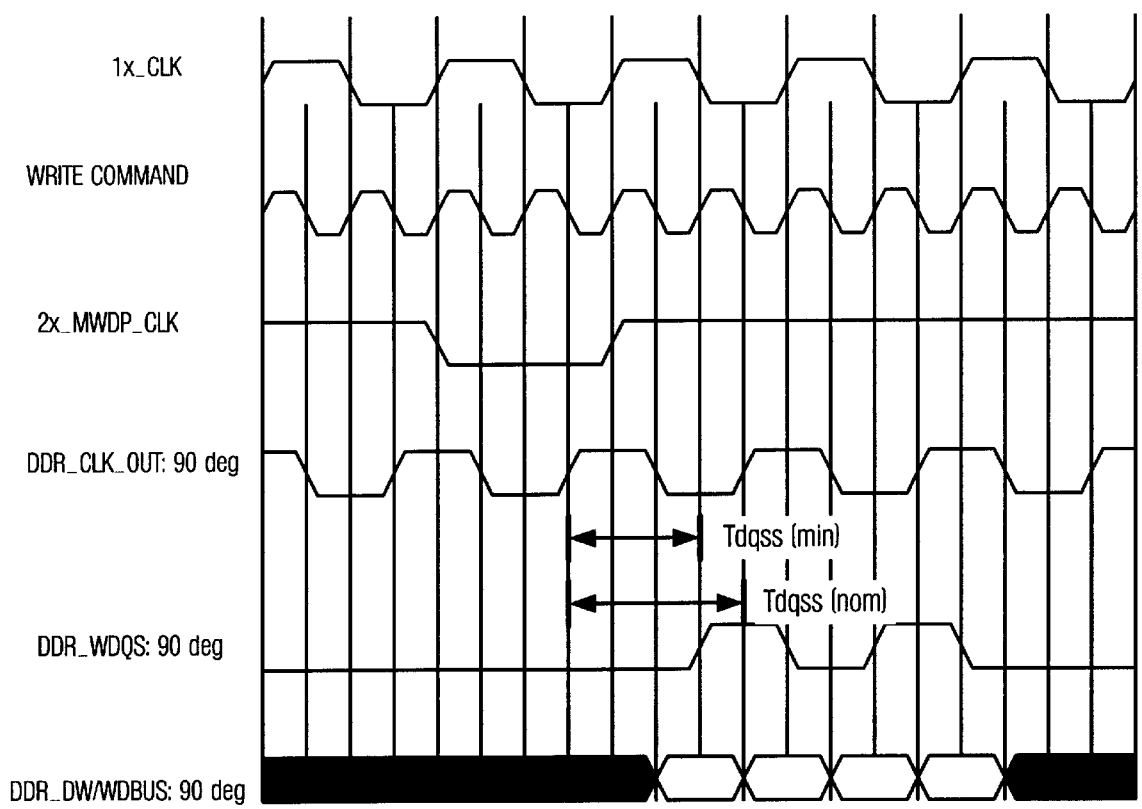
FIG. 3 depicts a timing diagram showing the memory clock phase advanced 90 degrees with Tdqss minimum/ nominal.

In FIG. 3, a timing diagram 300 depicts a DDR memory clock (DDR_CLK_OUT) phase-advanced by 90 degrees with respect to the internal memory controller clock. The DDR write data channel (DDR_WDQS, DDR_DM/WDBUS) is programmed for either a 90 degree or a 0 degree phase advance. This effectively enables the DDR write channel to be configured for a Tdqss minimum or a Tdqss nominal timing with respect to the DDR memory clock. The DDR write data channel signals can be delayed beyond the Tdqss minimum timing reference point via the programmable delay. As mentioned above with respect to FIG. 1, the 90 degree phase advance is accomplished by the addition of the XOR gate 144, controlled by the configuration register WRDTR[1] of FIG. 1, on the 2x_MWDP_CLK clock domain that drives the final output register stage for the DDR write channel signals.

Figure 4:
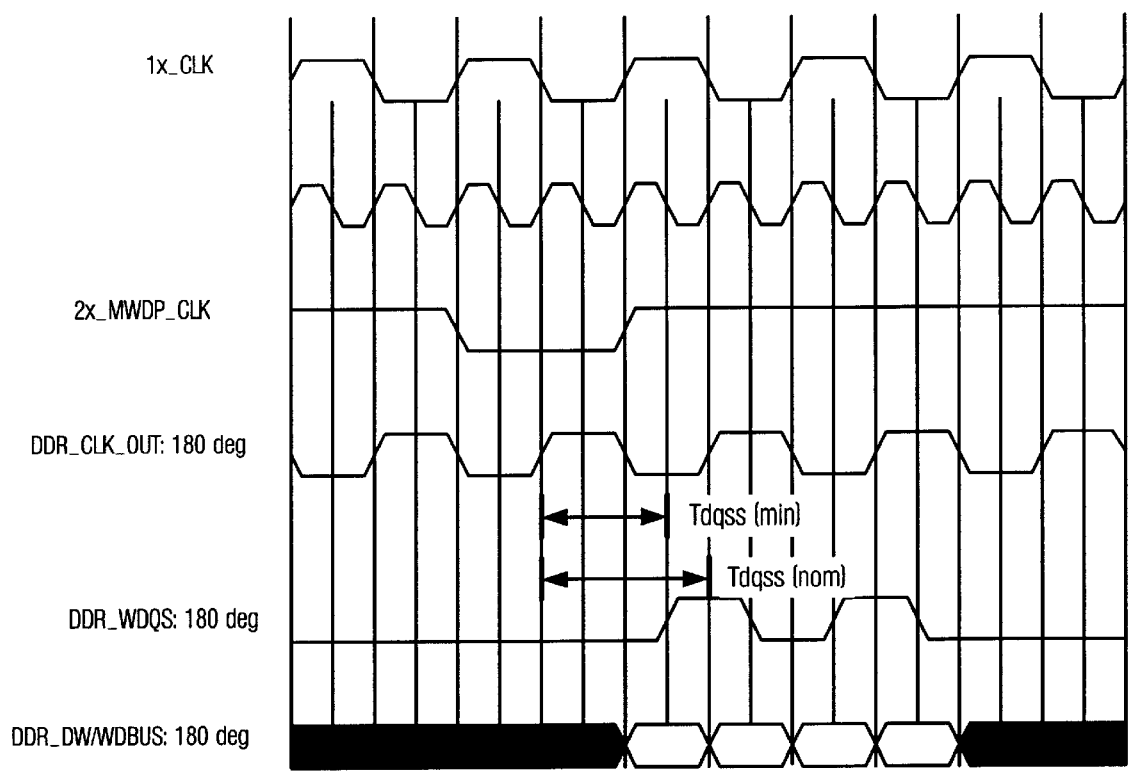
FIG. 4 depicts a timing diagram showing the memory clock phase advanced 180 degrees with Tdqss minimum/ nominal.

Now referring to FIG. 4, a timing diagram 400 depicts a DDR memory clock (DDR_CLK_OUT) phase-advanced by 180 degrees with respect to the internal memory controller clock. The DDR write data channel (DDR_WDQS, DDR_DM/WDBUS) is programmed for either a 180 degree or a 90 degree phase advance. This effectively enables the DDR write channel to be configured for a Tdqss minimum or a Tdqss nominal timing with respect to the DDR memory clock. Although not shown, the DDR write channel could be programmed for a 0 degree phase advance to achieve a Tdqss maximum timing. The DDR write data channel signals can be delayed beyond the Tdqss minimum timing reference point via the programmable delay. As mentioned above with respect to FIG. 1, the 180 degree phase advance is accomplished by selecting the appropriate pre-drive register stage through the configuration register WRDTR[0] of FIG. 1.

Figure 5:
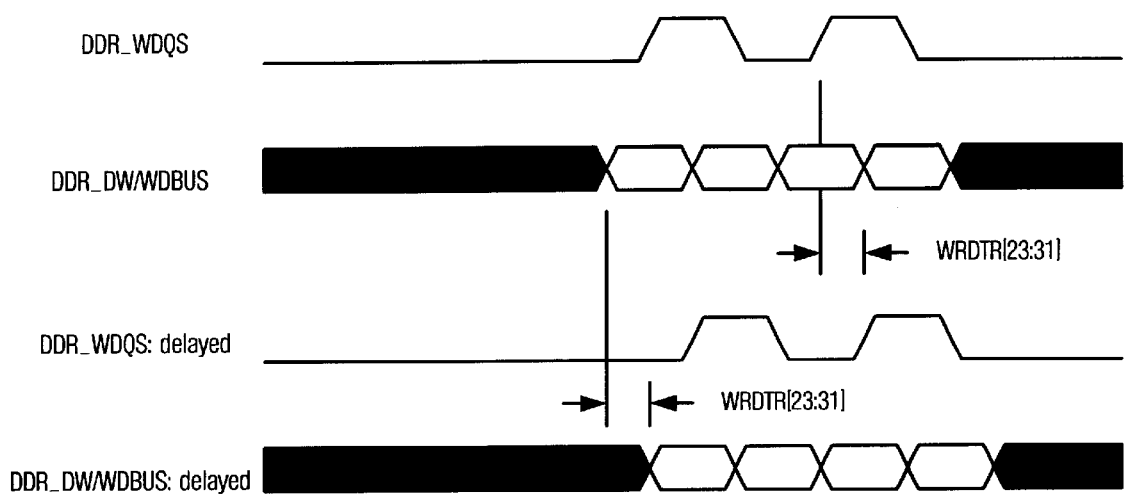
FIG. 5 depicts a timing diagram showing the DDR write channel programmable delay.

In FIG. 5, a timing diagram 500 depicts the effect of the programmable delay line on the DDR write data channel signals. The DDR_WDQS is delayed to the DDR_WDQS. Likewise, the DDR_DM/WDBUS is delayed to the DDR_DM/WDBUS. The amount of delay is determined by the value of the configuration register WRDTR[23:31], which is also shown in FIG. 1. This delay capability is independent of the phase advance shown in FIGS. 2–4, and can be used in conjunction with the phase advance to configure the DDR write data channel timings, if necessary, to satisfy the Tdqss timing window. Such adjustments would be made based on the overall system timing budget. As mentioned above with respect to FIG. 1, the phase delay capability is accomplished by the use of the programmable delays 138 and 140 of FIG. 1.

FIGS. 2–5 separately depict the phase advance and delay capabilities of the circuit 100 of FIG. 1. However, an actual phase adjustment achievable by the circuit 100 may be any combination of the phase advance and delay capabilities as separately depicted in FIGS. 2–5.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A memory controller for a double data rate (DDR) synchronous dynamic random access memory (SDRAM), the memory controller comprising:

a configuration register driven by an internal memory controller clock signal;

a first programmable delay connected to the configuration register for receiving a first set of one or more bits from the configuration register and a double-speed clock signal having a frequency twice as large as the frequency of the internal memory controller clock signal;

an XOR gate connected to the first programmable delay for receiving a phase-delayed double-speed clock signal from the first programmable delay and a second set of one or more bits from the configuration register;

a first flip-flop (FF) receiving a write command load signal and driven by the internal memory controller clock signal;

a first multiplexer receiving the output signal of the first FF and the write command load signal and controlled by a first control signal;

a second programmable delay connected to the configuration register for receiving the first set of one or more bits from the configuration register and the output signal of the first multiplexer;

a second FF receiving data mask and a low write data (DM/WDATA_L) signal and driven by an inverted signal of the internal memory controller clock signal;

a third FF receiving data mask and a high write data (DM/WDATA_H) signal and driven by the internal memory controller clock signal;

a fourth FF connected to the second programmable delay for receiving the output signal of the second programmable delay and driven by the output signal of the first programmable delay;

a fifth FF connected to the fourth FF for receiving the output signal of the fourth FF and driven by the output signal of the first programmable delay;

a sixth FF connected to the fifth FF for receiving the output signal of the fifth FF and driven by the output signal of the first programmable delay;

an OR gate connected to the fourth FF and the sixth FF for receiving the output signal of the fourth FF and the output signal of the sixth FF;

a seventh FF connected to the OR gate for receiving the output signal of the OR gate and driven by the output signal of the first programmable delay;

an eighth FF connected to the OR gate for receiving the output signal of the OR gate and driven by the output signal of the first programmable delay;

a ninth FF connected to the seventh FF for receiving the output signal of the seventh FF and driven by the output signal of the first programmable delay;

a second multiplexer connected to the seventh FF and the ninth FF for receiving the output signal of the seventh FF and the output signal of the ninth FF and controlled by a third set of one or more bits from the configuration register;

a tenth FF connected to the second multiplexer for receiving the output signal of the second multiplexer, outputting a write data strobe (DDR_WDQS), and driven by the output signal of the XOR gate;

a third multiplexer connected to the second and third FFs for receiving the output signal of the second FF and the output signal of the third FF and controlled by the output signal of the eighth FF;

an eleventh FF connected to the third multiplexer for receiving the output signal of the third multiplexer and driven by the output signal of the first programmable delay;

a fourth multiplexer connected to the third multiplexer and the eleventh FF for receiving the output signal of the third multiplexer and the output signal of the eleventh FF and controlled by the third set of one or more bits from the configuration register; and a twelfth FF connected to the fourth multiplexer for receiving the output signal of the fourth multiplexer, outputting a write data mask and write data (DDR_DM/WDBUS) signal, and driven by the output signal of the XOR gate.

2. The memory controller of claim 1, wherein the first and second programmable delays delay the phase of the DDR_WDQS and DDR_DM/WDBUS signals.

3. The memory controller of claim 1, wherein the first and second programmable delays delay the phase of the DDR_WDQS and DDR_DM/WDBUS signals and the amount of the phase delay is determined by the value of the first set of one or more configuration register bits.

4. The memory controller of claim 1, wherein the value of the second set of one or more configuration register bits determines whether the phase of the DDR_WDQS and DDR_DM/WDBUS signals is advanced by 90 degrees.

5. The memory controller of claim 1, wherein the value of the second set of one or more configuration register bits determines whether the phase of the DDR_WDQS and DDR_DM/WDBUS signals is advanced by 90 degrees, wherein the second set of one or more configuration register comprises one bit, and wherein the phase is advanced by 90 degrees when the value of the second portion is a logic 1.

6. The memory controller of claim 1, wherein the value of the third set of one configuration register bits determines whether the phase of the DDR_WDQS and DDR_DM/WDBUS signals is advanced by 0 or 180 degrees.

7. The memory controller of claim 1, wherein the value of the third set of one configuration register bits determines whether the phase of the DDR_WDQS and DDR_DM/WDBUS signals is advanced by 0 or 180 degrees, and wherein the third set of one configuration register bits comprises one bit.

8. The memory controller of claim 1, wherein the phase of the DDR_WDQS and DDR_DM/WDBUS signals is configured by determining the value of the first, second, and third sets of one or more configuration register bits.

9. The memory controller of claim 1, wherein the DDR_WDQS and DDR_DM/WDBUS signals are used to write data in a DDR SDRAM controlled by the memory controller.

10. The memory controller of claim 1, wherein the second multiplexer outputs the output signal of the ninth FF when the third set of one or more configuration register bits comprises one bit and the one bit is a logic 1, and outputs the output signal of the seventh FF when the third set of one or more configuration register bits comprises one bit and the one bit is a logic 0.

11. The memory controller of claim 1, wherein the third multiplexer outputs the output signal of the second FF when the output of the eighth FF is a logic 1, and outputs the output signal of the third FF when the output of the eighth FF is a logic 0.

12. The memory controller of claim 1, wherein the fourth multiplexer outputs the output signal of the eleventh FF when the third set of one or more configuration register bits comprises one bit and the one bit is a logic 1, and outputs the output signal of the third multiplexer when the third set of one or more configuration register bits comprises one bit and the one bit is a logic 0.

13. The memory controller of claim 1, wherein the configuration register is a 32-bit register.

14. The memory controller of claim 1, wherein the first control signal is a registered DIMM mode signal.

* * * * *

UNITED STATES PATENT AND TRADEMARK OFFICE
CERTIFICATE OF CORRECTION

PATENT NO.   : 6,504,790 B1                                                      Page 1 of 1
DATED        : January 7, 2003
INVENTOR(S)  : Wolford It is certified that error appears in the above-identified patent and that said Letters Patent is hereby corrected as shown below:

<u>Column 5,</u>
Line 15, delete "34" and insert -- ¾ --

Signed and Sealed this

Ninth Day of September, 2003

JAMES E. ROGAN
*Director of the United States Patent and Trademark Office*